United States Patent [19]
Gardner et al.

[11] Patent Number: 6,077,748
[45] Date of Patent: *Jun. 20, 2000

[54] ADVANCED TRENCH ISOLATION FABRICATION SCHEME FOR PRECISION POLYSILICON GATE CONTROL

[75] Inventors: Mark I. Gardner, Cedar Creek; Daniel Kadosh; Michael P. Duane, both of Austin, all of Tex.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/174,898

[22] Filed: Oct. 19, 1998

[51] Int. Cl.$^7$ ...................................................... H01L 21/22
[52] U.S. Cl. ............................................. 438/296; 257/510
[58] Field of Search ...................................... 438/197, 279, 438/294, 295, 296, 221, 424, 298; 257/374, 510

[56] References Cited

U.S. PATENT DOCUMENTS

| | | | |
|---|---|---|---|
| 4,803,173 | 2/1989 | Sill et al. | 438/296 |
| 5,177,028 | 1/1993 | Manning | 438/296 |
| 5,691,215 | 11/1997 | Dai et al. | 438/296 |
| 5,706,164 | 1/1998 | Jeng | 438/197 |
| 5,777,370 | 7/1998 | Omid-Zohoor et al. | 257/374 |
| 5,786,255 | 7/1998 | Yeh et al. | 438/299 |
| 5,911,105 | 6/1999 | Sasaki | 438/258 |

*Primary Examiner*—Olik Chaudhuri
*Assistant Examiner*—Anh Duy Mai
*Attorney, Agent, or Firm*—Skjerven, Morrill, MacPherson, Franklin & Friel, L.L.P.; William W. Holloway

[57] ABSTRACT

An IGFET device isolation structure fabrication scheme includes the formation of electrically insulating isolation structures that extend into the substrate and extend above the surface of the substrate. The isolation structures are formed by providing a first mask to form trenches in the substrate. A layer of silicon dioxide is then deposited, filling the trenches and extending above the surface of the substrate. A second mask layer is formed. The second mask layer shadows the trench regions that were formed in the substrate. The silicon dioxide not shadowed by the second mask layer is removed, leaving isolation structures that extend both into the substrate and which rise above the substrate. A gate structure is formed in the region between two isolation structures, and, in the preferred embodiment, the gate structure extends above the substrate to the same height as the isolation structures. The isolation structures and the gate structure can be used to provide self-aligned doped source/drain regions. Spacers can be added to the isolation structure walls and the gate structure walls to provide heavily-doped self-aligned regions.

16 Claims, 5 Drawing Sheets

ADVANCED TRENCH ISOLATION FABRICATION SCHEME FOR PRECISION POLYSILICON GATE CONTROL

BACKGROUND OF THE INVENTION

1. Field of the Invention

This invention relates generally to fabrication of integrated circuit devices and, more particularly, to the fabrication of insulated-gate, field effect transistors that are electrically isolated from neighboring integrated circuit elements by isolation structures.

2. Description of the Related Art

An insulated-gate field effect transistor (IGFET) device 5, such as a metal-oxide semiconductor field-effect transistor (MOSFET), having isolation structures that electrically insulate the transistor from the surrounding portions of the integrated circuit is shown in FIG. 1. A substrate 10 has a doped well region 12, a p-doped well will be used for purposes of illustration. The substrate 10 has a p-doped channel region 14 that provides a conducting path between the n-doped source/drain regions 16A, 16B and the n-doped source/drain regions 18A, 18B. In addition, an n-doped punch-through region 20 is provided below the channel region 14. Also formed in the substrate are the isolation structures 22 and 24. The gate structure of the IGFET device 5 includes an gate dielectric 26, directly over the channel region 20 and a gate electrode 28 over the gate dielectric 26. The gate structures 26, 28 can include spacers 30, 32 formed against the walls of the gate structure. An insulating layer 34 covers the substrate 10 and the gate structure 26, 28. The insulating layer 34 has vias formed therein and the vias are filled with a conducting material 36. The conducting material 36 provides conducting paths to source/drain (electrode) regions 16A, 16B and 18A, 18B and to the gate electrode 28. An insulating layer 38 is patterned and patterned portions are filled with conducting material to provide conducting paths 40. The conducting paths 40 and the remaining insulating material 38 are the interconnect layer 38, 40 that provides the electrical coupling between the IGFET device 5 and the remainder of the integrated circuit.

The operation of the IGFET device 5 can be understood as follows. A voltage applied to the gate electrode 28 causes a transverse field in the channel region 14. The transverse field controls (e.g., modulates) the current flow between source/drain regions 16A, 16B and source/drain region 18A, 18B. The punch-through region 20 is formed to prevent parasitic effects that can occur when this region is not formed in the device 5. The spacers 30, 32 and the dual-structured doped source/drain regions 16A, 16B and 18A, 18B address a problem generally referred to as the "hot-carrier" effect. When only one source/drain region 16A and 18A is present and is formed by doping technique aligned with the electrode structure 26, 28, charge carriers from these regions will be migrate into the channel region 14 and be trapped by the gate dielectric 26. These trapped charge carriers adversely effect the transverse electric field normally formed in the channel region 14 by a voltage applied to the gate electrode 28. The problem is alleviated by lightly-doping source/drain regions 16A and 18A by a technique that aligns this doping procedure with the gate structure 26, 28. Spacers 30 and 32 are next formed on the walls of the gate structure 26, 28. Source /drain regions 16B and 18B are formed by a doping procedure, resulting in source/drain doping concentrations at normal levels, that aligns the source/drain regions 16B and 18B with the spacers 30 and 32, respectively. (while this two level doping procedure effectively eliminates the "hot-carrier" problem, the resistance between the two source/drain dual regions 16A, 16B and 18A, 18B is increased.) The isolation structures 22, 24 provide electrical insulation between device 5 and a remainder of the integrated circuit.

A need has been felt for an improved process for the fabrication of IGFET devices that includes electrical isolation structures. A desirable feature of the process would be the replacement of the local oxidation of silicon (LOCOS) process, a process that has in the past been used to create the electrical isolation regions, with a process for better control of the structure of the isolation region. Another desirable feature of the process would be the ability to provide self-aligned, lightly-doped source/drain regions for the IGFET device. A further desirable feature of the process would be the ability to provide a device structure that would result in a planar structure for the IGFET device.

SUMMARY OF THE INVENTION

The foregoing and other features are accomplished, according to the present invention, by fabricating an IGFET device by first creating the silicon oxide isolation structures extending not only below the surface of the substrate, but also extending above the surface of the substrate. In the preferred embodiment, the isolation structures have a top surface that is coplanar with the top surface of the gate electrode. The isolation structures are created by forming a silicon oxide layer on the substrate, forming and patterning a photoresist layer on the silicon oxide layer, and creating trenches in the substrate at locations defined by the patterned photoresist layer. After removing the silicon oxide layer and the photoresist layer, a thick layer of silicon oxide is deposited on the exposed surface of the substrate and the silicon oxide layer is planarized. A photoresist surface is applied to the silicon dioxide layer and patterned. The patterned photoresist layer is directly above the trenches in the substrate (i.e., now filled with the material from the silicon oxide layer. The silicon oxide layer not shadowed by the patterned photoresist is removed. The remaining photoresist layer is removed and, in the preferred embodiment, the well, punch-through and channel regions are formed by appropriate implantation of ions. A gate dielectric layer is formed on the exposed surfaces and a polysilicon layer formed thereon. The polysilicon layer is planarized, thereby exposing the silicon oxide isolation structures. A photoresist layer is formed, patterned, and the resulting mask is used to expose selected portions of the substrate. The resulting polysilicon, gate dielectric layer is the gate structure for the IGFET device. The source/drain regions are then doped, by ion implantation in the preferred embodiment. When this doping procedure is used to provide lightly-doped source drain regions, then spacers can be formed and the normal source/drain regions (and the gate electrode doped regions) can be formed. The IGFET device is now substantially complete and the remaining process steps provide the formation of the vias and the conducting paths electrically coupled to the IGFET device. The interconnect layer(s) is (are) are now formed, the interconnect layer(s) providing electrical coupling between the IGFET device and the portions of the integrated circuit.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
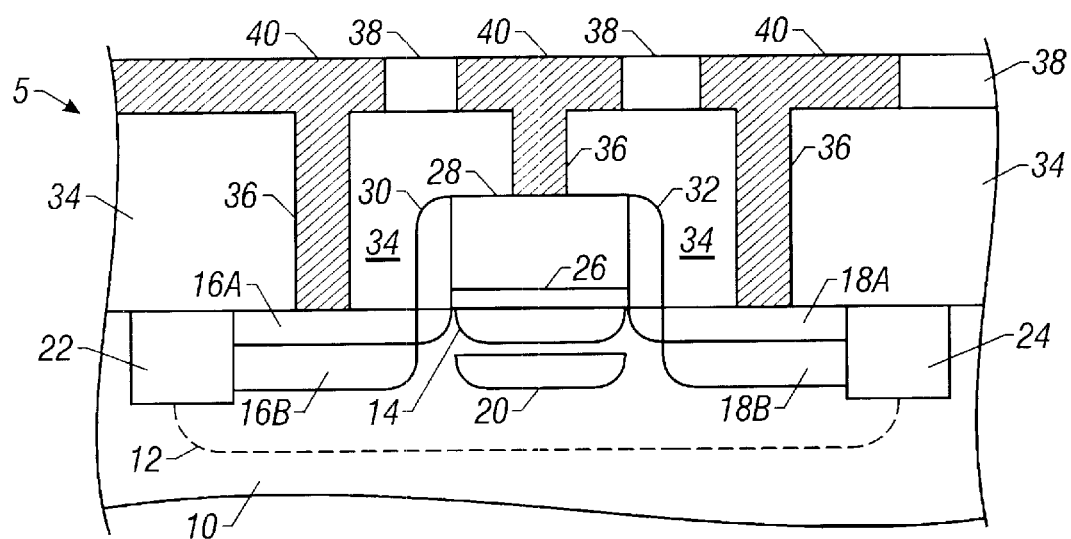
FIG. 1 is a cross-sectional view of an IGFET device having isolation trenches surrounding the device according to the prior art.

FIG. 1 has been discussed with respect to the related art.

Figure 2A:
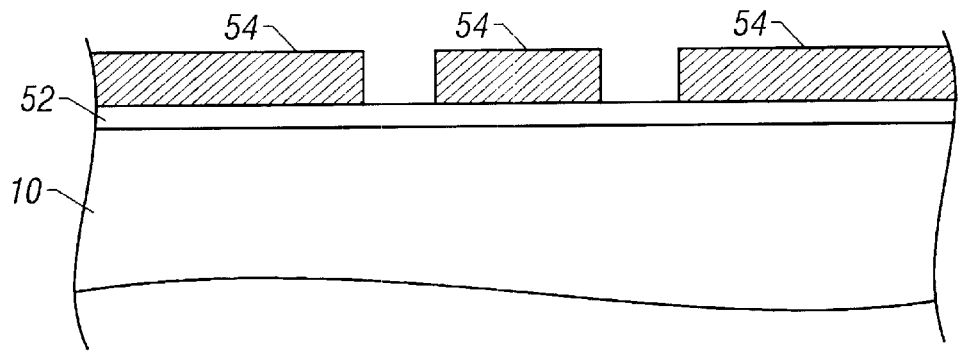
FIG. 2A–FIG. 2J illustrate the steps in fabricating an IGFET device having isolation structures according to the present invention.

Referring to FIG. 2A, a silicon oxide layer 52 of 100 to 300 Å is formed, either by epitaxial growth or by deposition, on substrate 10. A photoresist layer 54 is formed on the silicon oxide layer 12. The photoresist layer 54 is then patterned according to techniques well known in the art.

Figure 2B:
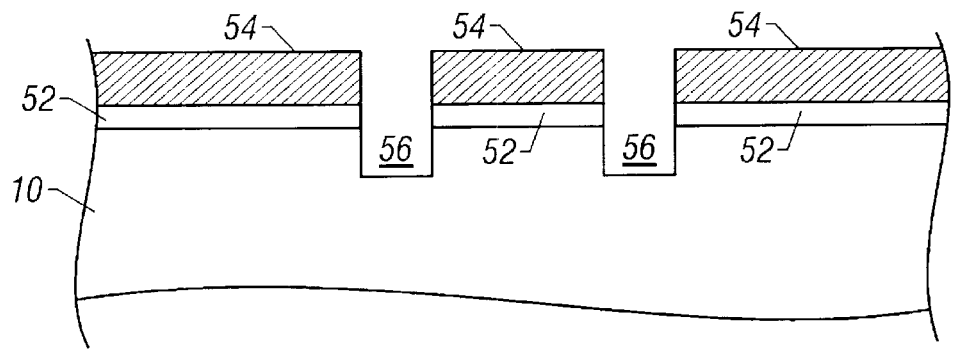

Referring next to FIG. 2B, trenches 56, with positions determined by the patterned photoresist layer 54, are etched through the oxide layer 52 and into the substrate 10 to a depth of 0.1 to 0.2$\mu$, (i.e., 1 to 2 kÅ).

Figure 2C:
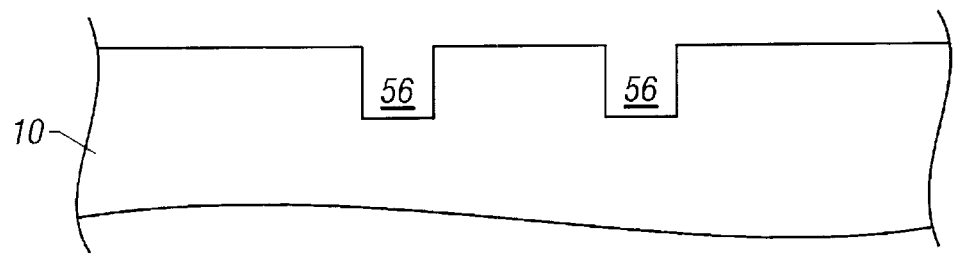

In FIG. 2C. the photoresist layer 54 and the silicon oxide layer 52 are removed from substrate 10. Trenches 56 remain in substrate 10.

Figure 2D:
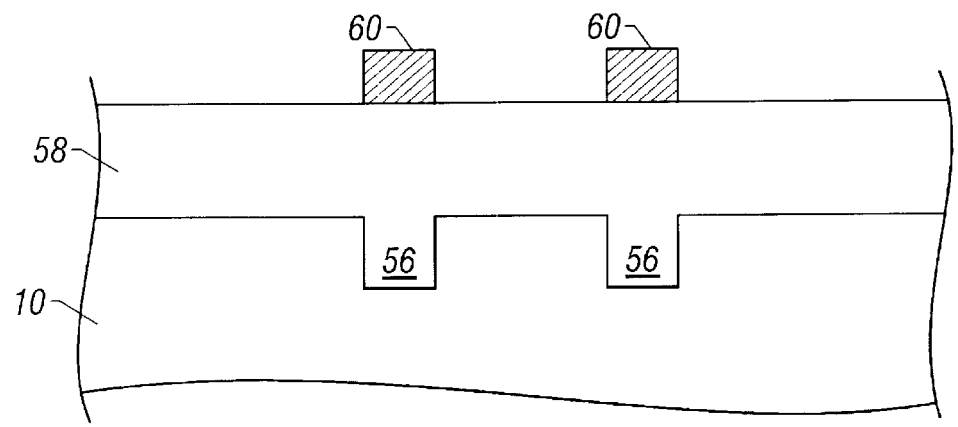

Referring to FIG. 2D, a layer of silicon oxide 58 having a thickness of 5 kÅ to 20 kÅ is deposited on the substrate and polished to a thickness of 2 kÅ to 3 kÅ. (As will be apparent after further discussion, the thickness of the silicon oxide layer 58 will be determined by the height of the gate structure of the IGFET device fabricated as a result of this process.) The photoresist layer 60 is patterned to provide a mask 60. The mask 60, as shown in FIG. 2D, is the inverse of the patterned photoresist mask of FIG. 2A. That is, the patterned (i.e., remaining) photoresist layer is positioned above the trenches 56 (now filled with silicon oxide) in the substrate 10.

Figure 2E:
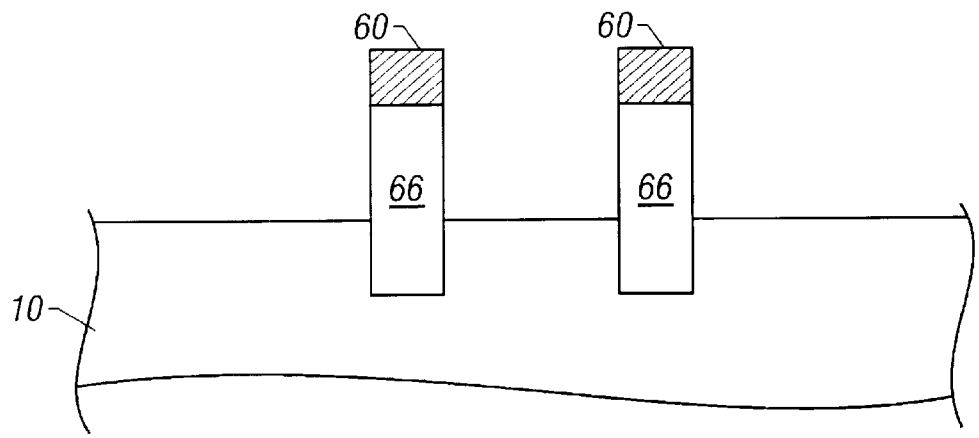

Referring to FIG. 2E, the silicon oxide layer 58 is etched to the surface of substrate 10 in the areas exposed by the patterned mask 60 to provide the silicon oxide structures 66. The silicon oxide (i.e., isolation) structures 66 resulting from this etch process extend from below the surface of the substrate 10 to above the surface of the substrate 10.

Figure 2F:
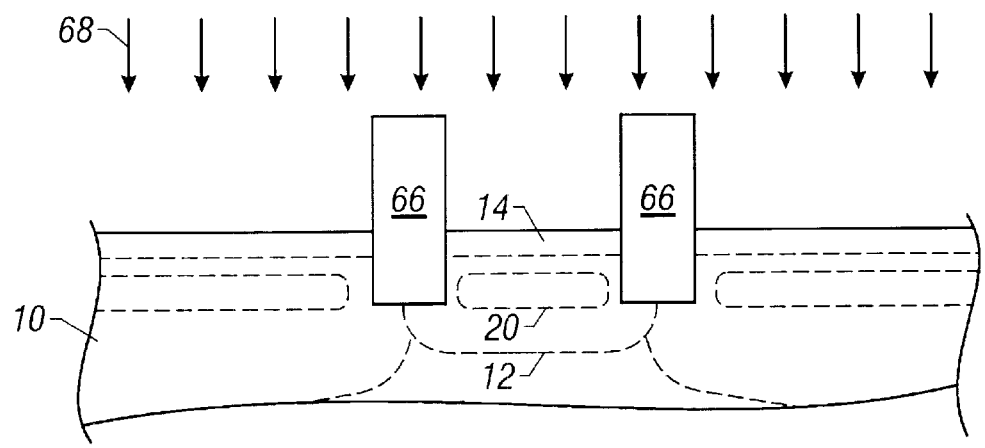

Referring to FIG. 2F, the photoresist mask 60 is removed. In the preferred embodiment, the substrate 10 can now be doped by ion implantation to provide the plurality of doped regions needed for a functioning device. The channel region can, be doped with arsenic ions or phosphorous ions to form an n-doped channel region 14 an n-doped punch-through region, 20 and an n-doped well region 12 or can be doped with boron to form a p-doped channel region, 14 a p-doped punch-through region, 20 and a p-doped well region 12 (For the doping of the source/drain regions, the doping ions are interchanged from those forming these regions in the substrate.) In order to implant the ions at the desired doping concentration and depth levels, phosphorous is implanted to form a channel region with an approximate energy of 5 to 15 keV with a total ion density of approximately $1\times10^{12}$ to $1\times10^{13}$ ions/cm$^2$; is implanted to form a punch-through region with an approximate energy of 75 to 225 keV with a total ion density of approximately $1\times10^{12}$ to $1\times10^{13}$ ions/cm$^2$, and is implanted to form a well region with an approximate energy of 150 to 600 keV at a total ion density of approximately $1\times10^{12}$ to $1\times10^{13}$ ions/cm$^2$. To implant ions at the desired doping concentrations and depth levels, boron is implanted to form a channel region with an approximate energy of 5 to 5 keV at a total doping density of approximately $1\times10^{12}$ to $1\times10^{13}$ ions/cm$^2$, is implanted to form a punch-through region with an approximate energy of 25 to 75 keV at a total doping density of approximately $1\times10^{12}$ to $1\times10^{13}$ ions/cm$^2$, and is implanted with an approximate energy of 50 to 200 keV at a total doping density of approximately $1\times1^{12}$ to $1\times10^{13}$ ions/cm$^2$. In FIG. 2F, the channel region 14, punch-through region 20, and well regions 12 are indicated by dotted lines. To simplify the discussion, these regions will not be shown in succeeding Figures. However, as will be clear to those skilled in the art, these Figures illustrate an implementation wherein the neighboring devices have regions of the same polarity. When the neighboring devices are formed with regions of the opposite polarity, then each set of devices having the same polarity will require separate implantation procedures, the areas of devices with the opposite polarity being masked during the implantation process. As will also be clear to those skilled in the art, this formation of doped regions can be performed at other times in the present procedure.

Figure 2G:
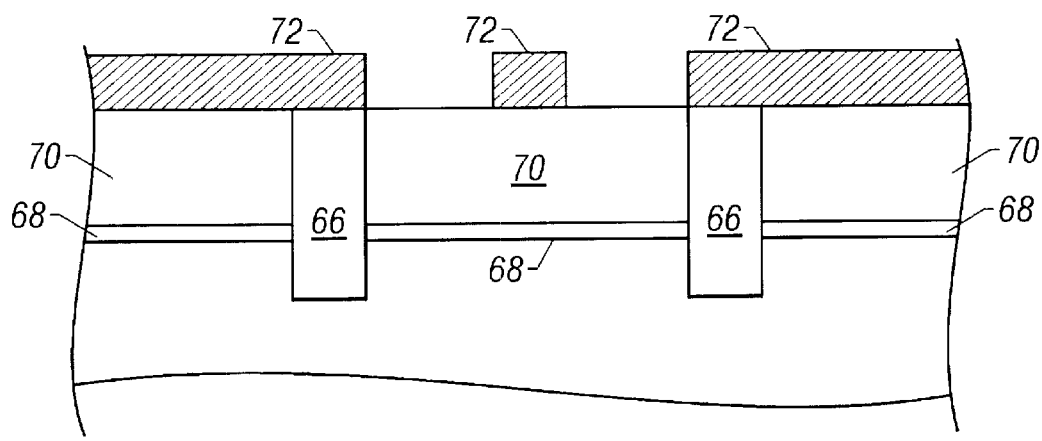

In FIG. 2G, a gate dielectric layer 68 (which can be silicon oxide, for example) is formed. The gate dielectric layer is typically 10–30 Å and can be formed by oxide growth, plasma deposition, or low pressure chemical/vapor deposition on the exposed surfaces of substrate 10. A polysilicon layer 70 is deposited on the gate dielectric layer 68 and on the silicon oxide structures 66. A chemical/mechanical polishing operation planarizes the surface of the polysilicon layer 70 and exposes upper surfaces of the silicon oxide regions 66. A photoresist layer 72 is formed on the surface of the polysilicon layer 70 and the exposed surfaces of the silicon oxide structures 66.

Figure 2H:
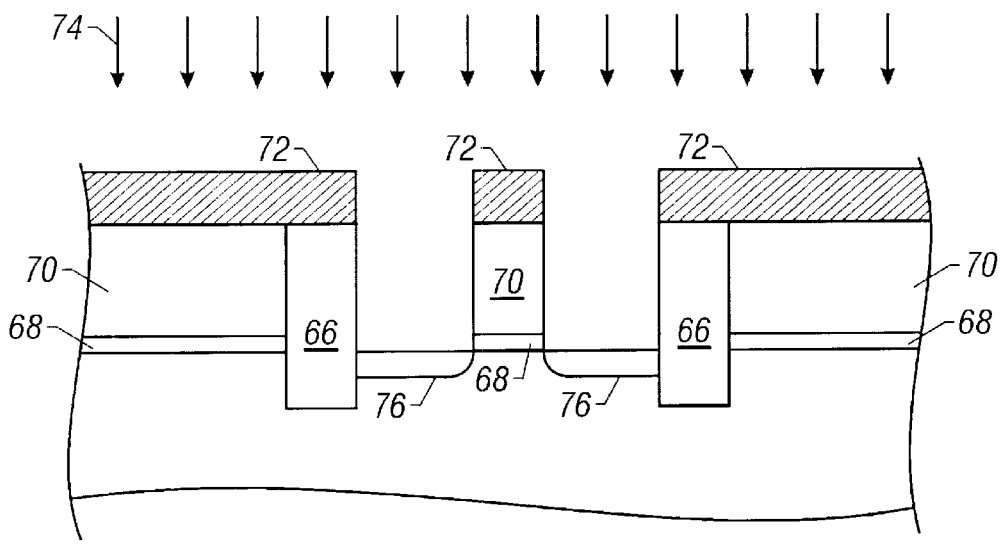

Referring next to FIG. 2H, the exposed polysilicon layer is removed, typically with an anisotropic etch. The etching process is extended until the surface of substrate 10 therefor is exposed. As will be clear, a gate structure 68, 70 has been formed. Source/drain regions 76 are now formed by implantation of ions 74. The gate structure 68, 70 provides for self-alignment of the source/drain regions 76. If the effects of "hot-carriers" are to be minimized, the source/drain regions 76 can be used to form the lightly-doped portions of the source drain regions. The lightly-doped regions are formed by the implantation of ions having the opposite polarity of those ions forming the channel region. The ions are implanted at an energy of 5 to 50 keV with a concentration of $1\times10^{13}$ to $1\times10^{14}$.ions/cm$^2$. When however, the "hot-carrier effects are not to be addressed, then source/drain regions 76 are doped at an energy of 5 to 50 keV at a concentration of $1\times10^{15}$ to $1\times10^{15}$ ions/cm$^2$. When lightly-doped source/drain regions are not implemented, then the procedures of FIG. 2I will not be performed.

Figure 2I:
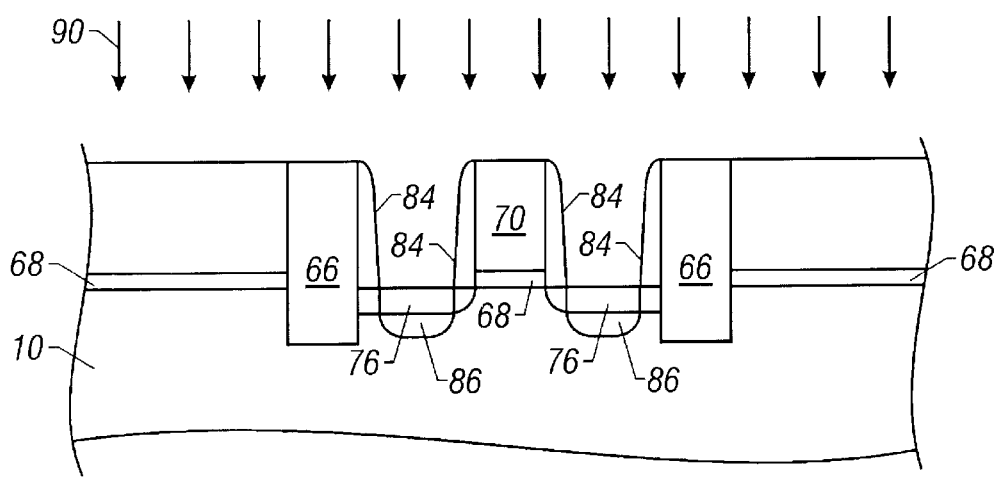

In FIG. 2I, after the lightly-doped regions 76 are formed, then silicon oxide spacers 84 are formed on the walls of gate structure 68, 70 (and on the walls of isolation structures 66). The spacers 84 can be formed by a 2000 Å blanket deposition of SiN$_3$, followed by an isotropic etch. The device is then subjected to an ion 90 implantation procedure that forms source/drain regions 86. The ions 90 are implanted at an energy of 5 to 50 keV with a concentration of $1\times10^{13}$ to $1\times10^{14}$. ions/cm$^2$. The spacers 84 provide for the self-alignment of the ions 90, shielding the lightly-doped source/drain region proximate the channel region from this ion implant. As will be clear, the implantation of ions for the source/drain regions 76, 86 can also provide the requisite doping of the gate electrode 70.

Figure 2J:
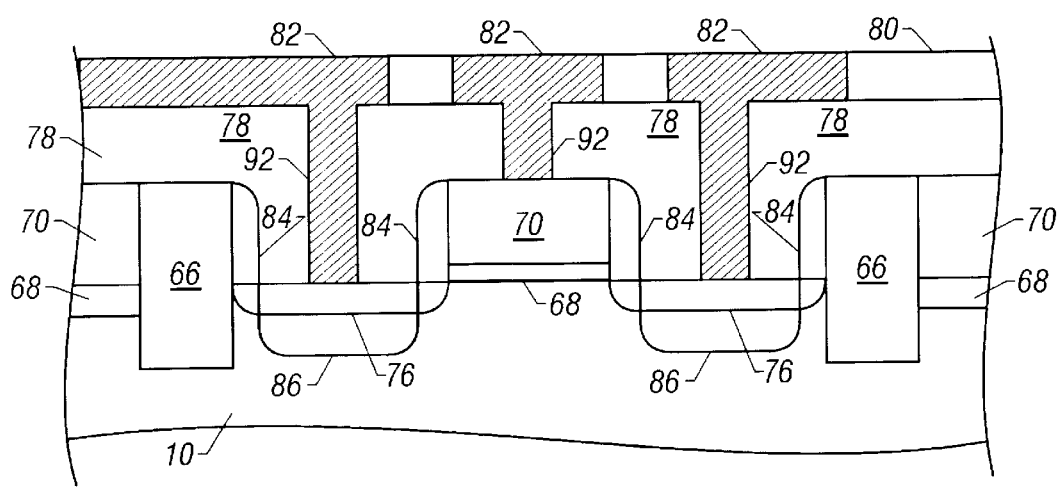

Referring to FIG. 2J, the results of the remaining steps in the formation of an IGFET device are shown. After the formation of the source/drain regions 76 or the formation of the source/drain regions 76, 86, a silicon oxide layer 78 is formed and planarized. A photoresist mask is formed on the silicon oxide layer 78. As a result of the etching process on the areas of silicon oxide layer 78 exposed by the photoresist mask to the etching material, vias are formed that extend to the surfaces of the source/drain regions 76, 86 formed in the substrate 10 and to the gate electrode 70. The structure then has a layer, for example, of cobalt or titanium applied thereto. The structure is then subjected to a rapid thermal anneal at 550° C. to 700° C. in a nitrogen atmosphere. The result of this process is form a salicide (e.g., $CoSi_2$ or $TiSi_2$) on the surface of the substrate 10 and the gate electrode 70. The salicide layer provides a low resistance contact area. An RCA cleaning solution can remove the excess metal not reacted by the salicide process. Another rapid thermal anneal at 600° C. to 800° C. results in a phase change in the remaining salicide that reduces the contact resistance even further. A liner deposition of titanium or TiN, for example with a thickness of 250 to 500 Å is then performed. The surface of the silicon oxide is polished so that the titanium or TiN is removed from the surfaces of the silicon oxide. A layer of conducting material (i.e, polysilicon, tungsten) is then deposited on the silicon oxide layer, the layer of conducting material filling the vias to provide conducting vias 92. After polishing the surface of silicon oxide layer 78, i.e., to remove the excess conducting material, a layer of silicon oxide 80 is formed and is etched and filled with a conducting material (e.g., aluminum) to form conducting paths 82 on the interconnect layer. The conducting paths 82 of the interconnect layer are electrically coupled to the conducting vias 92. A plurality of interconnect layers may be formed, the interconnect layers providing distribution of signals in the integrated circuit.

Those skilled in the art will readily implement the steps necessary to provide the structures and the methods disclosed herein, and will understand that the process parameters, materials, dimensions, and sequence of steps are given by way of example only and can be varied to achieve the desired structure as well as modifications that are within the scope of the invention. Variations and modifications of the embodiments disclosed herein may be made based on the description set forth herein, without departing from the spirit and scope of the invention as set forth in the following claims. By way of specific example, and as pointed out previously, the formation of the channel, well, and punch-through regions of the IGFET device can be performed at several stages in the foregoing fabrication process without departing from the scope of the invention.

What is claimed is:

1. A method for fabricating an IGFET device, the method comprising the steps of:
    forming a first and a second trench in a substrate;
    fabricating a first and a second isolation structure, said first and second isolation structure filling said first and second trenches, said first and said second isolation structures extending a predetermined distance above a surface of said substrate, wherein fabricating the first and the second isolation structure includes:
        forming a silicon oxide layer over said substrate;
        forming a mask layer, said mask layer aligned with said trenches; and
        removing said oxide layer in a region between said trenches;
    forming a plurality of doped regions in said substrate;
    providing a gate structure between said first and said second isolation structures and separated therefrom, said gate structure extending above said surface of said substrate by said predetermined distance;
    forming source/drain regions in said substrate in between gate structure and said isolation structures;
    forming an insulating layer between said gate structure and said isolation structures, and
    forming conducting vias in said insulating layer, said conducting vias electrically coupled to said source/drain regions.

2. The method of claim 1 wherein the step of forming a first and a second trench includes the steps of:
    covering at least a preselected portion of said surface of said substrate with a layer of silicon oxide;
    forming and patterning a photoresist layer on said layer of silicon oxide;
    etching into said substrate a predetermined distance to form said first and said second trench; and
    removing said photoresist layer.

3. The method of claim 1 wherein said gate structure includes:
    a gate dielectric portion formed on said surface of said substrate; and
    a gate electrode formed on said gate dielectric, wherein said gate structure extends above said surface of said substrate generally the same distance as said isolation structures.

4. The method of claim 1 wherein the step of fabricating a first and a second isolation structure further includes the step of forming walls of said first and said second isolation structures to be generally perpendicular to a surface of said substrate.

5. The method of claim 1 wherein said step of forming source/drain regions includes the step of implanting ions between said gate structure and said isolation structure.

6. The method of claim 5 wherein said step of forming source/drain regions includes the steps of:
    lightly doping said substrate between said gate structure and said isolation structures;
    forming spacers on sides of said gate structure; and
    heavily doping said substrate in regions not shielded by said spacers.

7. The method of claim 1 wherein the step of forming said doped regions includes at least one of the steps of:
    forming a well region for said IGFET device;
    forming a punch-through region for said IGFET device; and
    forming a channel regions for said IGFET device.

8. The method of claim 1 further comprising the steps of:
    forming conducting vias electrically coupled to said gate structure and to said source drain regions; and
    forming an interconnect layer having conducting paths formed therein;
    wherein said conducting paths are formed to coupled to selected conducting vias.

9. In an integrated circuit having at least one insulated gate, field effect transistor (IGFET) device, a method of fabricating said IGFET device comprising the steps of:
    etching trenches into a substrate;
    forming isolation structures extending into said trenches and extending a predetermined distance above a surface of said substrate, wherein forming the isolation structures includes:

forming a layer of silicon oxide on said surface;

forming and patterning a photoresist layer on a surface of said layer of silicon oxide; wherein said pattern of said photoresist layer shadows said trenches; and etching said silicon oxide to a surface of said substrate in a region not shadowed by said patterning of said photoresist layer;

doping a plurality of regions in said substrate;

forming a gate structure between said isolation structures and separated therefrom, wherein the gate structure extends above said surface of said substrate said predetermined distance;

doping said substrate to form source/drain regions between said gate structure and said isolation structures;

forming an insulating layer between said gate structure and said isolation structures, and forming conducting vias in said insulating layer, said conducting vias electrically coupled to said source drain regions.

10. The method of claim 9 wherein said etching step includes the steps of:

forming a silicon oxide layer on said surface;

forming and patterning a photoresist layer on said silicon oxide; and anisotropically etching regions of said substrate exposed by patterning said photoresist layer.

11. The method of claim 9 wherein said step of doping a plurality of regions includes the step forming by ion implantation at least one of the following regions;

a well region; and a punch-through region.

12. The method of claim 9 wherein said step of doping said substrate to form source/drain regions includes the step of doping said source drain regions by ion implantation.

13. The method of claim 9 wherein said step of doping said substrate to form source drain regions includes the steps of:

doping said substrate by ion implantation to form a lightly-doped source/drain region;

forming spacers on walls of said gate structure; and doping said substrate by ion implantation to form a second doped source/drain region.

14. The method of claim 9 wherein said step of forming a gate structure includes the steps of:

forming a layer of gate dielectric on said surface;

forming a layer of polysilicon on said layer of gate dielectric; and etching preselected portions of said layer of gate dielectric and said layer of polysilicon to form said gate structure.

15. The method of claim 9 wherein said isolation structures provide electrical isolation from a remainder of said integrated circuit.

16. The method of claim 9 further comprising the step of forming conducting vias extending away from said substrate and electrically coupled to said gate electrode and to said source/drain regions.

* * * * *